(12) United States Patent
Cheng et al.

(10) Patent No.: US 11,631,516 B2
(45) Date of Patent: Apr. 18, 2023

(54) INDUCTOR STACK STRUCTURE

(71) Applicant: ANHUI YUNTA ELECTRONIC TECHNOLOGIES CO., LTD., Ningguo (CN)

(72) Inventors: Wei Cheng, Ningguo (CN); Chengjie Zuo, Ningguo (CN); Jun He, Ningguo (CN)

(73) Assignee: ANHUI YUNTA ELECTRONIC TECHNOLOGIES CO., LTD., Ningguo (CN)

( * ) Notice: Subject to any disclaimer, the term of this patent is extended or adjusted under 35 U.S.C. 154(b) by 341 days.

(21) Appl. No.: 16/754,798

(22) PCT Filed: Sep. 28, 2018

(86) PCT No.: PCT/CN2018/108197
§ 371 (c)(1),
(2) Date: Apr. 9, 2020

(87) PCT Pub. No.: WO2019/196354
PCT Pub. Date: Oct. 17, 2019

(65) Prior Publication Data
US 2020/0303109 A1    Sep. 24, 2020

(30) Foreign Application Priority Data

Apr. 13, 2018  (CN) .......................... 201810331302.5
Apr. 13, 2018  (CN) .......................... 201820525282.0

(51) Int. Cl.
*H01F 5/00*     (2006.01)
*H01F 27/28*    (2006.01)
(Continued)

(52) U.S. Cl.
CPC ......... *H01F 17/0013* (2013.01); *H01F 27/28* (2013.01); *H01F 27/34* (2013.01); *H01L 23/5227* (2013.01); *H01F 2017/002* (2013.01)

(58) Field of Classification Search
CPC ...... H01F 17/0013; H01F 27/28; H01F 27/34; H01F 2017/002; H01L 23/5227
See application file for complete search history.

(56) References Cited

U.S. PATENT DOCUMENTS 5,849,355 A * 12/1998 McHenry ................. H03H 3/00
                                                   333/167
7,262,680 B2    8/2007 Wang
2014/0217546 A1 8/2014 Yen et al.

FOREIGN PATENT DOCUMENTS

CN  101752226 A   6/2010
CN  102087907 A   6/2011
(Continued)

OTHER PUBLICATIONS

Examination Report (IN 202027012318), dated Mar. 24, 2021.
(Continued)

*Primary Examiner* — Kenneth B Wells
(74) *Attorney, Agent, or Firm* — Hunton Andrews Kurth LLP

(57) ABSTRACT

Provided is an inductor stack structure. The inductor stack structure include a substrate; at least two metal layers sequentially stacked on one side of the substrate, each metal layer at least comprises a first plane inductor; a through hole, which is located between any two neighboring metal layers, first plane inductors in different metal layers are electrically connected through the through hole; and a thickness of the through hole is greater than that of the metal layer.

7 Claims, 2 Drawing Sheets

(51) Int. Cl.
    *H01F 27/34*      (2006.01)
    *H01L 23/522*      (2006.01)
    *H01F 17/00*      (2006.01)

(56) References Cited

FOREIGN PATENT DOCUMENTS

| | | | |
|---|---|---|---|
| CN | 103972207 A | | 8/2014 |
| CN | 108346642 A | | 7/2018 |
| JP | 2001284533 A | | 10/2001 |
| JP | 2001308538 A | * | 11/2001 |
| JP | 2007235034 A | | 9/2007 |
| JP | 2009266908 A | | 11/2009 |
| JP | 2014082493 A | | 5/2014 |
| JP | 2014-207432 A | | 10/2014 |
| JP | 2014232837 A | | 12/2014 |
| JP | 2016529732 A | | 9/2016 |
| WO | WO 9712440 A1 | * | 4/1997 |

OTHER PUBLICATIONS

Notification of Reason for Refusal (KR 10-2020-7010411), dated Jun. 21, 2021.
Notice of Reasons for Rejection dated Aug. 3, 2021 issued in Japanese Patent Application No. 2020-538816.
International Search Report (PCT/CN2018/108197), dated Dec. 6, 2018.

* cited by examiner

INDUCTOR STACK STRUCTURE

CROSS REFERENCE TO RELATED APPLICATION

This application is based on and claims priority to a Chinese patent application No. 201810331302.5 filed on Apr. 13, 2018 and a Chinese patent application No. 201820525282.0 filed on Apr. 13, 2018, disclosures of which are incorporated herein by reference in their entireties.

TECHNICAL FIELD

Embodiments of the present disclosure relate to an integrated circuit technology, for example, an inductor stack structure.

BACKGROUND

With the increasing development of electronic products, the research and development of various components are moving towards high integration and multiple functions. Therefore, the requirements for the integrated circuit structure of the devices are increasing.

In the design of integrated circuits, the design for the inductor is often a difficult problem. At the present stage, two problems exist in the inductor in the integrated circuit. One is that the quality factor of the inductor (i.e., the Q value) is low, which influences the circuit performance. The other is that the inductor area is large, which influences the circuit integration, size and manufacture cost.

SUMMARY

The application provides an inductor stack structure. When the quality factor and the inductance value of the inductor are both maintained high, the area of the inductor is small, and the area of the integrated circuit is reduced.

The application provides an inductor stack structure, which includes: a substrate; at least two metal layers sequentially stacked on one side of the substrate, each of the at least two metal layers at least comprises a first plane inductor; a through hole, which is located between any two neighboring ones of the at least two metal layers, first plane inductors in different ones of the at least two metal layers are electrically connected through the through hole; a thickness of the through hole is greater than a thickness of each of the at least two metal layers.

In one embodiment, the first plane inductors in the different ones of the at least two metal layers are connected in series or in parallel.

In one embodiment, vertical projections of the first plane inductors in the any two neighboring ones of the at least two metal layers on the substrate are overlapped.

In one embodiment, corresponding overlapped portions of the first plane inductors in the any two neighboring ones of the at least two metal layers have a same current direction.

In one embodiment, at least one of the at least two metal layers further includes a second plane inductor, the second plane inductor is insulated from the first plane inductor, and vertical projection of the second plane inductor and vertical projection of any one of the first plane inductors on the substrate are not overlapped.

In one embodiment, the first plane inductor is a plane spiral structure.

In one embodiment, the through hole includes a metal column.

In one embodiment, the inductor stack structure further includes a functional element, the functional element is located between the substrate and a metal layer closest to the substrate; the functional element comprises at least one of a transistor, a diode, a resistor, an inductor, a capacitor, or an acoustic wave device.

In one embodiment, the metal layer is manufactured by an electroplating process.

In one embodiment, a material of the substrate is one of silicon, quartz, sapphire or glass.

The present application provides an inductor stack structure, through configuring multiple metal layers including the first plane inductor to increase the inductance value in the inductor stack structure, and connecting the first plane inductors in different metal layers through the through hole with the thickness greater than that of the metal layer, the inference between the different first plane inductors may be reduced. Compared with the scheme in the existing art, in a case where the mutual inductance of the first plane inductors in different metal layers are not greatly reduced, the parasitic capacitance between different metal layers may be greatly reduced, so that a high quality factor and inductance value is maintained and the area of the integrated circuit may be reduced when the inductor has a small area.

DETAILED DESCRIPTION

The present application will be further described in detail with reference to the accompanying drawings and embodiments. It is to be understood that the embodiments set forth below are intended to illustrate and not to limit the present application. It is to be noted that to facilitate description, only part, not all, of structures related to the present application are illustrated in the accompanying drawings.

Figure 1:
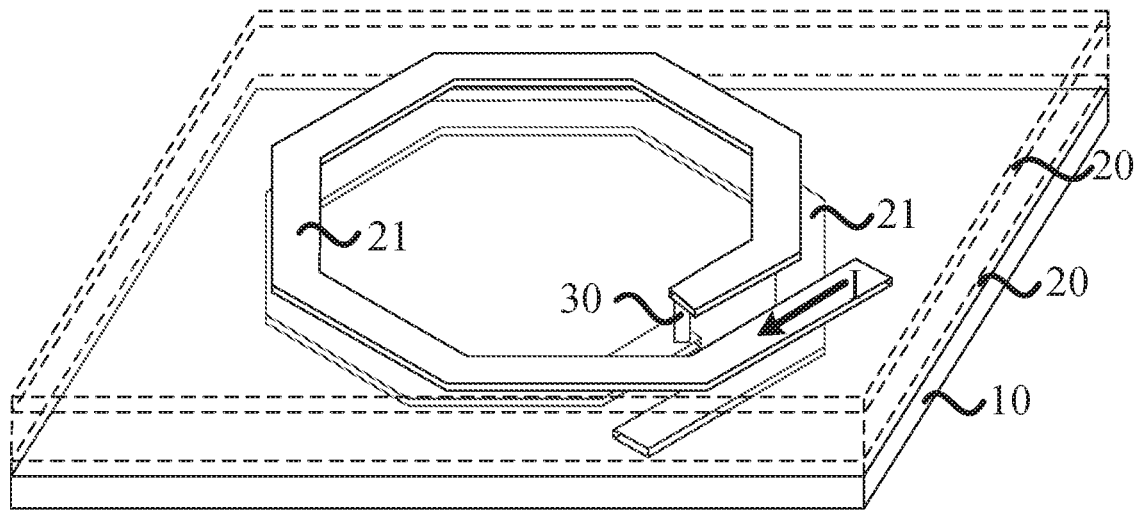
FIG. 1 is a structure diagram of an inductor stack structure according to an embodiment.

FIG. 1 is a structure diagram of an inductor stack structure according to an embodiment. Referring to FIG. 1, the embodiment of the present disclosure provides an inductor stack structure, which includes a substrate 10, at least two metal layers 20 sequentially stacked on one side of the substrate 10, a through hole 30. Each metal layer 20 at least includes a first plane inductor 21, the through hole 30 is located between any two neighboring metal layers 20, first plane inductors 21 in different metal layers 20 are electrically connected through the through hole 30. A thickness of the through hole 30 is greater than that of the metal layer 20.

The substrate 10 plays a role of supporting the metal layer 20 in the inductor stack structure. In one embodiment, a material of the substrate 10 is one of silicon, quartz, sapphire and glass. It is to be understood that other materials may be used to form the substrate 10 according to actual demands.

The metal layer 20 may be formed on the substrate 10, and in one embodiment, the metal layer 20 may be manufactured by an electroplating process. It is to be noted that the metal layer 20 manufactured by the electroplating process is only an example of the embodiment, and may also be manufactured by other processes.

In an integrated circuit, a high requirement for configuration of an inductor is provided. In some applications, the inductor in the integrated circuit is required to have a high inductance value and the area of the integrated circuit is required to be reduced, so that high integration may be implemented.

Generally, to obtain an inductor with a higher quality factor (i.e., a Q value), the first plane inductors 21 of different metal layers 20 are electrically connected through the through hole 30 having a similar shape of the first plane inductors 21, so that first plane inductors 21 of different metal layers 20 are connected in parallel, i.e., the thickness of an inductor coil is substantially increased, thereby increasing the Q value. However, the inductance value in per unit the thickness of the metal layer 20 is increased, and the inductance value in per unit area is also decreased while increasing the thickness of the metal layer 20. In this case, the designer needs to make a choice between the inductance value and the Q value in per unit area. Therefore, it is a difficult problem to implement synchronous promotion of the inductance value and the Q value in the same area.

To reduce the area of the integrated circuit, and improve the inductance value and the quality factor of the inductor, at least two metal layers 20 including the first plane inductors 21 are disposed on the substrate 10, and mutual inductance may be generated between different first plane inductors 21 and the inductance value of the inductor is increased. To reduce a parasitic capacitance between the different first plane inductors 21, the different first plane inductors 21 are connected through the through hole 30, and the thickness of the through hole is greater than that of the metal layer 20, so that high mutual inductance is provided between the different first plane inductors 21, and the parasitic capacitance between two metal layers are greatly reduced, thereby increasing the inductance value and the quality factor of the inductor stack structure.

To avoid unnecessary electrical connection between the different metal layers 20 and between the through hole 30 and each of the first plane inductors 21, an insulating layer may be disposed between the different metal layers 20, and the insulating layer may wrap the through hole to prevent short circuits in the inductor stack structure, and ensure that the inductor stack structure may be operated normally.

It is to be noted that, to maintain the quality factor of the inductor and ensure conductivity of the inductor stack structure, the through hole 30 may be formed of a metal with high conductivity. In one embodiment, the through hole 30 may include a metal column. Exemplarily, the through hole 30 is a copper cylinder.

The inductor stack structure provided by the embodiment, through disposing the first plane inductors in different metal layers, and connecting to the different first plane inductors through the through hole, the thickness of the through hole is greater than that of the metal layer, when the quality factor and the inductance value of the inductor are both maintained high, the area of the inductor may not be increased and the area of the integrated circuit may be reduced.

Referring to FIG. 1, in one embodiment, the first plane inductor 21 is a plane spiral structure.

It is to be noted that the plane spiral inductor is easy to be integrated and has a low cost, therefore, the first plane inductor may be configured to be the plane spiral structure. However, the first plane inductor configured to be the plane spiral structure is merely an example provided by the embodiment, and is not intended to limit the present application. The first plane inductor 21 may be a plane inductor with a structure of another shape.

In one embodiment, the first plane inductors 21 in the different metal layers 20 may be connected in series or in parallel.

The first plane inductors 21 of the different metal layers 20 may be connected through the through hole 30 according to actual demands. The different first plane inductors 21 may be connected in series or in parallel, or partially connected in series, and partially connected in parallel.

Referring to FIG. 1, when the different first plane inductors 21 are connected in series, a total inductance value in the inductor stack structure is a sum of inductance values of all the first plane inductors 21, and then when the inductance values in the inductor stack structure are large, the different first plane inductors 21 may be connected in series.

In one embodiment, vertical projections of the first plane inductors 21 in the any two neighboring metal layers 20 on the substrate 10 may be overlapped.

When the vertical projections of the different first plane inductors 21 on the substrate 10 are overlapped, the area of the vertical projection of each metal layer 20 on the substrate 10 may be reduced, and the area of the substrate and the inductor stack structure may be reduced, so as to reduce the area of the integrated circuit.

In one embodiment, corresponding overlap portions of the first plane inductors 21 in the any two neighboring metal layers 20 have a same current direction.

When a certain distance is provided between the adjacent first plane inductors 21, mutual inductance may be generated between the first plane inductors 21. When adjacent first plane inductors 21 have the same current direction, and have an overlapping area in a direction which is perpendicular to the substrate 10. The adjacent first plane inductors 21 have magnetic fields in the same direction, the magnetic flux density of the first plane inductors 21 is increased, and the mutual inductance value between the first plane inductors 21 is increased, and the total inductance value in the inductor stack structure is increased.

Exemplarily, the metal layers are configured to be two, and the area of the metal layers are the same. When a length of the metal layer is 0.68 mm and a width of the metal layer 0.74 mm, the thickness of each metal layer is configured to be 6 μm. The thickness of the through hole in the existing art is 2 μm, and the vertical projections of the through hole and the first plane inductors in the two metal layers are completely overlapped, i.e. the two first plane inductors are connected in parallel by using the through hole having a similar shape of the first plane inductors 21. The embodiment adopts a through hole with a thickness of 20 μm to connect two first plane inductors in series. Exemplarily, the through hole is a copper cylinder so that the two first plane inductors have a same current direction (which may refer to FIG. 1).

TABLE 1

Inductance values and quality factors of inductors in the embodiment and the existing art

| | Length (mm) | Width (mm) | Area (mm2) | Inductance value (nH@1 GHz) | Q value (@1 GHz) |
|---|---|---|---|---|---|
| In the existing art | 0.68 | 0.74 | 0.5032 | 1.52 | 57.9 |
| In the embodiment of the present application | 0.68 | 0.74 | 0.5032 | 3.3 | 61.7 |

TABLE 1-continued

Inductance values and quality factors of inductors
in the embodiment and the existing art

| Length (mm) | Width (mm) | Area (mm2) | Inductance value (nH@1 GHz) | Q value (@1 GHz) |
| --- | --- | --- | --- | --- |

Note: a unit of the inductance value is nH, a measurement frequency is 1 GHz, and an expression mode is nH@1 GHz. The Q value has no evaluation dimension, the measurement frequency is 1 GHz, and the expression mode is @1 GHz.

Referring to table 1, compared with the configuration structure in the existing art, in the present embodiment, connecting the first plane inductors in different metal layers through the through hole with the thickness greater than that of the metal layer may greatly increase the inductance value in the inductor stack structure and may keep the quality factor of the inductor to be basically unchanged. That is, the technical solution provided in the embodiment can increase the inductance value of the inductor in the inductor stack structure while maintaining a high quality factor of the inductor under the same area.

TABLE 2

Inductance values and quality factors of inductors
in the embodiment and the existing art when the
through hole having the different thickness

| | Through hole thickness (μm) | Inductance value (nH@1 GHz) | Q value (@1 GHz) |
| --- | --- | --- | --- |
| In the existing art | 2 | 1.52 | 57.9 |
| In the embodiment of the present application | 2 | 3.56 | 35.5 |
| | 5 | 3.41 | 47.0 |
| | 10 | 3.38 | 57.5 |
| | 20 | 3.30 | 61.7 |
| | 40 | 3.16 | 62.7 |

In addition to the thickness of the through hole, each experimental parameter in table 2 is the same with that in table 1.

It is to be noted that, in the embodiment, the thickness of the through hole has a certain influence on the performance of the inductor. Keeping each parameter unchanged and only changing the thickness of the through hole in the embodiment are to determine the thickness range of the through hole so as to improve the performance of the inductor stack structure.

When the thickness of the through hole is changed, the inductance value and the quality factor of the inductor are both changed. When the thickness of the through hole is the same with that in the existing art, although the inductance value is greatly increased, since the parasitic capacitance is too large, the quality factor of the inductor is greatly reduced. To maintain a high inductance value and quality factor, the thickness of the through hole may be configured to be greater than that of the metal layer.

Therefore, in the present embodiment, the thickness of the through hole is larger than that of the metal layer, so as to ensure that the inductance value and quality factor may be maintained high while reducing the area of the integrated circuit.

Figure 2:
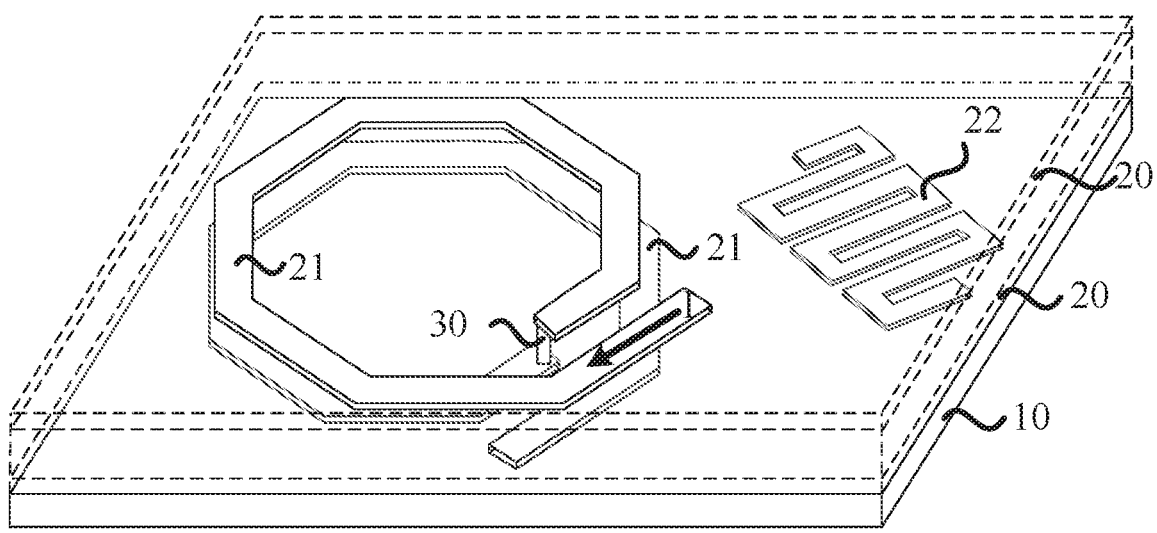
FIG. 2 is a structure diagram of another inductor stack structure according to an embodiment.

FIG. 2 is a structure diagram of another inductor stack structure according to an embodiment. Referring to FIG. 2, in one embodiment, at least one of the metal layers 20 further includes a second plane inductor 22, the second plane inductor 22 is insulated from the first plane inductor 21, and vertical projections of the second plane inductor 22 and any one of the first plane inductors 21 on the substrate are not overlapped.

When two plane inductors are provided in the same metal layer 20, the second plane inductor 22 may be configured to be insulated from the first plane inductor 21 located in the same metal layer 20, so that the two plane inductors may be connected to other components separately and implement corresponding functions and reduce the interference.

It is to be noted that, in a vertical direction of the substrate 10, when the first plane inductor 21 in the neighboring metal layer 20 simultaneously has an overlapping area with the first plane inductor 21 and the second plane inductor 22 in the metal layer 20, mutual interference between the inductors may exist and influence the performance of the inductor stack structure. Therefore, to ensure the performance of the inductor stack structure, the inductors in the inductor stack structure are required to be configured one-to-one correspond to each other, i.e., the plane inductor in the neighboring metal layer 20 may be overlapped with a vertical projection of the plane inductor on the substrate 10, avoiding a case where the first plane inductor 21 and the second plane inductor 22 in the same metal layer 20 simultaneously overlap with the vertical projection of the first plane inductor 21 in the adjacent metal layer 20 on the substrate 10.

Figure 3:
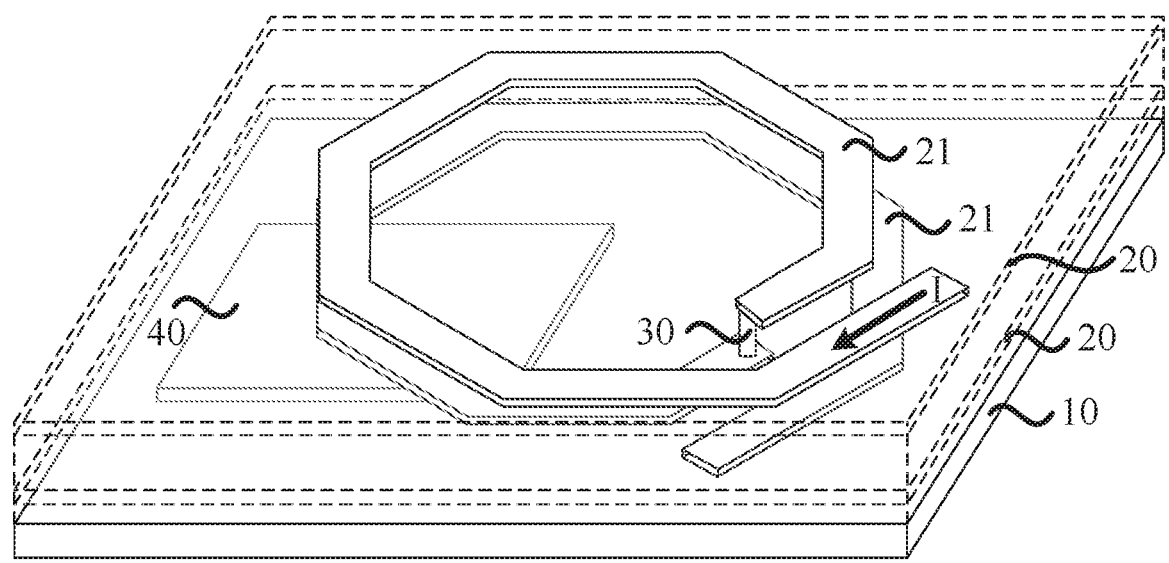
FIG. 3 is a structure diagram of another inductor stack structure according to an embodiment.

FIG. 3 is a structure diagram of another inductor stack structure according to an embodiment. Referring to FIG. 3, in one embodiment, the inductor stack structure may further include a functional element 40, the functional element 40 is located between the substrate 10 and a metal layer 20 closest to the substrate 10; and the functional element 40 includes at least one of a transistor, a diode, a resistor, an inductor, a capacitor, and an acoustic wave device.

It is to be noted that the functional element 40 may also be located at other locations, such as between any two metal layers 20, but it is considered that the functional element 40 needs to be configured in an area with a well flat performance. Therefore, the functional element 40 may be configured between the substrate 10 and a metal layer 20 closest to the substrate 10.

The functional element 40 may be disposed in the inductor stack structure so that a certain preset function may be implemented. The functional element 40 may determine its specific structure according to actual demands. The functional element being the transistor, the capacitor, and the acoustic wave device is merely specific example of the embodiment, and is not intended to limit the present application, and the functional element may also be other elements such as a chip, etc.

What is claimed is:

1. An inductor stack structure, comprising:
   a substrate;
   at least two metal layers sequentially stacked on one side of the substrate, a first plane inductor is disposed in each of the at least two metal layers;
   a through hole, which is located between any two neighboring ones of the at least two metal layers, first plane inductors in different ones of the at least two metal layers are electrically connected through the through hole;
   wherein a thickness of the through hole is greater than a thickness of each of the at least two metal layers;
   wherein the through hole comprises a metal column;
   wherein vertical projections of the first plane inductors in the any two neighboring ones of the at least two metal layers on the substrate are overlapped; and wherein corresponding overlapped portions of the first plane inductors in the any two neighboring ones of the at least two metal layers have a same current direction.

2. The inductor stack structure of claim 1, wherein the first plane inductors in the different ones of the at least two metal layers are connected in series or in parallel.

3. The inductor stack structure of claim 1, wherein at least one of the at least two metal layers is further disposed with a second plane inductor, the second plane inductor is insulated from the first plane inductor, and vertical projection of the second plane inductor and vertical projection of any one of first plane inductors on the substrate are not overlapped.

4. The inductor stack structure of claim 1, wherein the first plane inductor is a plane spiral structure.

5. The inductor stack structure of claim 1, further comprising a functional element, the functional element is located between the substrate and a metal layer closest to the substrate;

the functional element comprises at least one of a transistor, a diode, a resistor, an inductor, a capacitor, or an acoustic wave device.

6. The inductor stack structure of claim 1, wherein the metal layer is manufactured by an electroplating process.

7. The inductor stack structure of claim 1, wherein a material of the substrate is one of silicon, quartz, sapphire or glass.

* * * * *